US009997430B2

(12) United States Patent
Omura

(10) Patent No.: US 9,997,430 B2
(45) Date of Patent: Jun. 12, 2018

(54) HEAT DISSIPATION STRUCTURE OF SEMICONDUCTOR DEVICE

(71) Applicant: OMRON Corporation, Kyoto (JP)

(72) Inventor: Eiichi Omura, Nara (JP)

(73) Assignee: OMRON Corporation, Kyoto (JP)

( * ) Notice: Subject to any disclaimer, the term of this patent is extended or adjusted under 35 U.S.C. 154(b) by 0 days. days.

(21) Appl. No.: 15/410,781

(22) Filed: Jan. 20, 2017

(65) Prior Publication Data

US 2017/0301602 A1 Oct. 19, 2017

(30) Foreign Application Priority Data

Apr. 15, 2016 (JP) ................................ 2016-081964

(51) Int. Cl.
*H01L 23/367* (2006.01)
*H01L 23/00* (2006.01)
(Continued)

(52) U.S. Cl.
CPC ...... *H01L 23/3672* (2013.01); *H01L 23/3114* (2013.01); *H01L 23/3677* (2013.01); *H01L 23/4006* (2013.01); *H01L 23/433* (2013.01); *H01L 23/49827* (2013.01); *H01L 23/49838* (2013.01); *H01L 24/32* (2013.01);
(Continued)

(58) Field of Classification Search
CPC . H01L 23/3672; H01L 24/83; H01L 23/4006; H01L 23/49827; H01L 23/49828; H01L 23/3114; H01L 24/32; H01L 2023/4068; H01L 2023/4087; H01L 2224/32227; H01L 2224/83232;
(Continued)

(56) References Cited

U.S. PATENT DOCUMENTS 6,111,322 A 8/2000 Ando et al.
6,292,367 B1 * 9/2001 Sikka ................. H01L 23/3731 165/185

(Continued)

FOREIGN PATENT DOCUMENTS

DE 60315469 4/2008
DE 102014205958 10/2015

(Continued)

OTHER PUBLICATIONS

"Search Report of Europe Counterpart Application," dated Aug. 7, 2017, p. 1-p. 8.

(Continued)

*Primary Examiner* — Alexander Oscar Williams
(74) *Attorney, Agent, or Firm* — JCIPRNET

(57) ABSTRACT

A heat dissipation structure of a semiconductor device with excellent heat dissipation applicable to surface-mount thin semiconductor devices is provided, and preferably a heat dissipation structure of a semiconductor device also with excellent insulating reliability is provided. In a heat dissipation structure 101 of a semiconductor device 10, the semiconductor device 10 has an electric bonding surface 11*a* electrically connected with a substrate 20 and a heat dissipation surface 11*b* on an opposite side thereof, wherein the heat dissipation surface 11*b* is bonded or contacted to a heat spreader 31 via a non-insulated member 32, and the heat spreader 31 is bonded or contacted to a heat sink 30 via an insulated member 41.

6 Claims, 5 Drawing Sheets

(51) Int. Cl.
*H01L 23/31* (2006.01)
*H01L 23/40* (2006.01)
*H01L 23/498* (2006.01)
*H01L 23/433* (2006.01)

(52) U.S. Cl.
CPC ...... *H01L 24/83* (2013.01); *H01L 2023/4068* (2013.01); *H01L 2023/4087* (2013.01); *H01L 2224/32227* (2013.01); *H01L 2224/83232* (2013.01)

(58) Field of Classification Search
CPC ... H01L 23/3677; H01L 23/433; H01L 23/42; H01L 23/36; H01L 23/367
See application file for complete search history.

(56) References Cited

U.S. PATENT DOCUMENTS

2004/0164402 A1* 8/2004 Yoshimura .......... H01L 23/3737 257/706
2004/0169289 A1* 9/2004 Satou .................. H01L 23/3107 257/780
2005/0056926 A1* 3/2005 Chen ....................... H01L 23/10 257/706
2005/0133908 A1* 6/2005 Lee ..................... H01L 21/4871 257/718
2008/0122071 A1* 5/2008 Tseng .................... H01L 21/568 257/720
2008/0142955 A1* 6/2008 Chen ..................... H01L 23/367 257/713
2008/0157344 A1* 7/2008 Chen ................... H01L 23/3121 257/706
2010/0327431 A1 12/2010 Touzelbaev et al.
2011/0031610 A1* 2/2011 Yamazaki ........... H01L 23/4985 257/693
2011/0240279 A1 10/2011 Furman et al.
2012/0168930 A1* 7/2012 Sato .................... H01L 23/3675 257/698
2013/0314877 A1 11/2013 Watanabe et al.
2014/0210059 A1* 7/2014 Brodsky ............... H01L 23/295 257/659
2014/0233188 A1* 8/2014 Terasawa ............. H05K 7/1432 361/719
2014/0239482 A1 8/2014 Kourakata et al.
2015/0130045 A1* 5/2015 Tseng ...................... H01L 23/36 257/712

FOREIGN PATENT DOCUMENTS

| | | |
|---|---|---|
| EP | 2770530 | 8/2014 |
| JP | 2000-311971 | 11/2000 |
| JP | 2003133514 | 5/2003 |
| JP | 2007109794 | 4/2007 |
| JP | 2008-028163 | 2/2008 |
| JP | 2014-241340 | 12/2014 |

OTHER PUBLICATIONS

"Office Action of Taiwan Counterpart Application," dated Jan. 19, 2018, with English translation thereof, pp. 1-12.
"Office Action of Korea Counterpart Application," with English translation thereof, dated Mar. 13, 2018, pp. 1-12, in which the listed references were cited.

* cited by examiner

HEAT DISSIPATION STRUCTURE OF SEMICONDUCTOR DEVICE

CROSS-REFERENCE TO RELATED APPLICATION

This application claims the priority benefit of Japanese application serial no. 2016-081964, filed on Apr. 15, 2016. The entirety of the above-mentioned patent application is hereby incorporated by reference herein and made a part of this specification.

BACKGROUND OF THE INVENTION

1. Field of the Invention

The present invention relates to a heat dissipation structure (also referred to as cooling structure) of a surface-mount semiconductor device, in particular, to a heat dissipation structure with heat dissipation and insulating reliability applicable to thin packaged semiconductor device.

2. Description of Related Art

FIG. 4(*a*) is a general stereogram of a lead type discrete part 1 of the prior art, and FIG. 4(*b*) is a general stereogram of a surface-mount semiconductor device 10 developed in recent years.

With high speed of a semiconductor switch element, parasitic inductance of the element has to be reduced. Different from the discrete part 1 (e.g., lead type Insulated Gate Bipolar Transistor (IGBT)) of the prior art shown in FIG. 4(*a*), for example, in the semiconductor device 10 shown in FIG. 4(*b*), the speed of the switch is very high, and thus, in order to implement the parasitic inductance as small as possible, device package thinning is being promoted.

Such a semiconductor device 10, as shown in FIG. 4(*b*), is received in an ultrathin package 11, for example, it includes: an electric bonding surface 11*a* provided with more than one electrode (terminal) 12 electrically connected with a substrate; and a heat dissipation surface 11*b*, wherein a large heat dissipation electrode 13 is provided on an opposite side of the electric bonding surface 11*a*. During mounting of the semiconductor device 10, excellent heat dissipation and insulating reliability are required, for example, technologies of Patent Document 1 to Patent Document 3 are proposed.

DOCUMENTS OF THE PRIOR ART

Patent Document 1: Japanese Patent Gazette No. 2014-241340

Patent Document 2: Japanese Patent Gazette No. 2000-311971

Patent Document 3: Japanese Patent Gazette No. 2008-028163

SUMMARY OF THE INVENTION

Problem to be Solved

FIG. 5(*a*) is a general sectional view of a heat dissipation structure 201 of the prior art, and FIG. 5(*b*) is a general sectional view of a heat dissipation structure 201A as the varying example.

In the heat dissipation structure 201 shown in FIG. 5(*a*), on a heat sink 30 as an example of having a conductive heat-dissipation/cooling part (hereinafter referred to as "heat-dissipation part"), a semiconductor device 10 is carried via an insulated part 41 in a manner of bonding or contacting the heat dissipation surface 11*b* downwards, and an electrode 12 of the electric bonding surface 11*a* is welded to a lower surface pattern 22 of the substrate 20.

According to the heat dissipation structure 201, heat produced by the semiconductor device 10 is transferred to the heat sink 30 from the heat dissipation surface 11*b* via the insulated part 41.

Moreover, in the heat dissipation structure 201A shown in FIG. 5(*b*), the lower surface pattern 22 of the substrate 20 is contacted onto the heat sink 30 via the insulated part 41, and an upper surface pattern 21 of the substrate 20 and the electrode 12 of the electric bonding surface 11*a* of the semiconductor device 10 are welded together.

According to the heat dissipation structure 201A, heat produced by the semiconductor device 10 is transferred to the heat sink 30 from the electrode 12 of the electric bonding surface 11*a* via a thermal via or inlay disposed on the substrate 20 and the insulated part 41.

The heat dissipation structures 201 and 201A have the following problems, but problem 1) has to be eliminated at first, that is, a thermal resistor between the semiconductor device 10 and the heat sink 30 as a heating element becomes minimum. Then, preferably, problem 2) to problem 4) can also be eliminated.

1) heat dissipation (cooling) performance of the heating element (semiconductor device 10) (thermal conduction of the insulated part 41)

2) insulation of an upper surface electrode and a lower surface electrode on the package 11

3) insulation of the package 11 from the heat dissipation part 4) electric wiring of the substrate 20 and insulation of the heat dissipation part In view of such problems of the former technology, the present invention is directed to a heat dissipation structure of a semiconductor device with excellent heat dissipation applicable to surface-mount thin semiconductor devices, and preferably, a heat dissipation structure of a semiconductor device also with excellent insulating reliability is provided.

Technical Means of Solving the Problems

In order to achieve the objective, in the heat dissipation structure of the semiconductor device of the present invention, the semiconductor device has an electric bonding surface electrically connected with a substrate and a heat dissipation surface on an opposite side thereof, wherein the heat dissipation surface is bonded or contacted to a conductive member with high thermal conductivity via a non-insulated member, and the conductive member with high thermal conductivity is bonded or contacted to a heat dissipation part via a first insulated member.

Herein, preferably, the thickness of the conductive member with high thermal conductivity is greater than that of the semiconductor device, the conductive member with high thermal conductivity, in a top view, is less than the heat dissipation part, and in a situation where the semiconductor device and the conductive member with high thermal conductivity, for example, are both set as a substantially rectangular shape in a top view, the length of each side of the conductive member with high thermal conductivity is greater than the sum of twice the thickness of the conductive member with high thermal conductivity and the length of each side of the semiconductor device. However, the conductive member with high thermal conductivity, in a top view, is not limited to the substantially rectangular shape, for example, it may also be a substantially round shape, as long as the size thereof is determined according to the substantially rectangular shape. Moreover, preferably, the first insulated member, in a top view, is greater than the conductive member with high thermal conductivity.

According to the heat dissipation structure of a semiconductor device, heat produced by the semiconductor device is transferred to the conductive member with high thermal conductivity from the heat dissipation surface via the non-insulated member to be diffused, and then is transferred to the heat dissipation part via the first insulated member, which thus has excellent heat dissipation.

In the heat dissipation structure of a semiconductor device of the present invention, it is also possible to configure a second insulated member between the substrate and the conductive member with high thermal conductivity in a manner of covering the periphery of the semiconductor device and at least one part of a pattern of the substrate. Then, the second insulated member may also be configured in a manner of occupying a space between the substrate and the heat dissipation part.

Here, the second insulated member may also have a through-hole for fixing to the heat dissipation part. The second insulated member, for example, may also be configured through an insulation heat-resistant resin formed or cut processed product, an insulation heat-resistant tape, an insulation heat-resistant sealing element, or a combination of any two or more thereof.

The heat dissipation structure of a semiconductor device with such a structure can have excellent heat dissipation and can also avoid damage to insulation.

Effect of the Invention

According to the heat dissipation structure of a semiconductor device of the present invention, heat produced by the semiconductor device is transferred to the conductive member with high thermal conductivity from the heat dissipation surface via the non-insulated member to be diffused, and then is transferred to the heat dissipation part via the first insulated member, which thus has excellent heat dissipation.

Then, when a second insulated member is configured between the substrate and the conductive member with high thermal conductivity in a manner of covering the periphery of the semiconductor device and at least one part of a pattern of the substrate, the heat dissipation structure can have excellent heat dissipation and can also avoid damage to insulation.

DESCRIPTION OF THE EMBODIMENTS

Several embodiments of the present invention are described below with reference to the accompanying drawings.

First Embodiment

Figure 1:
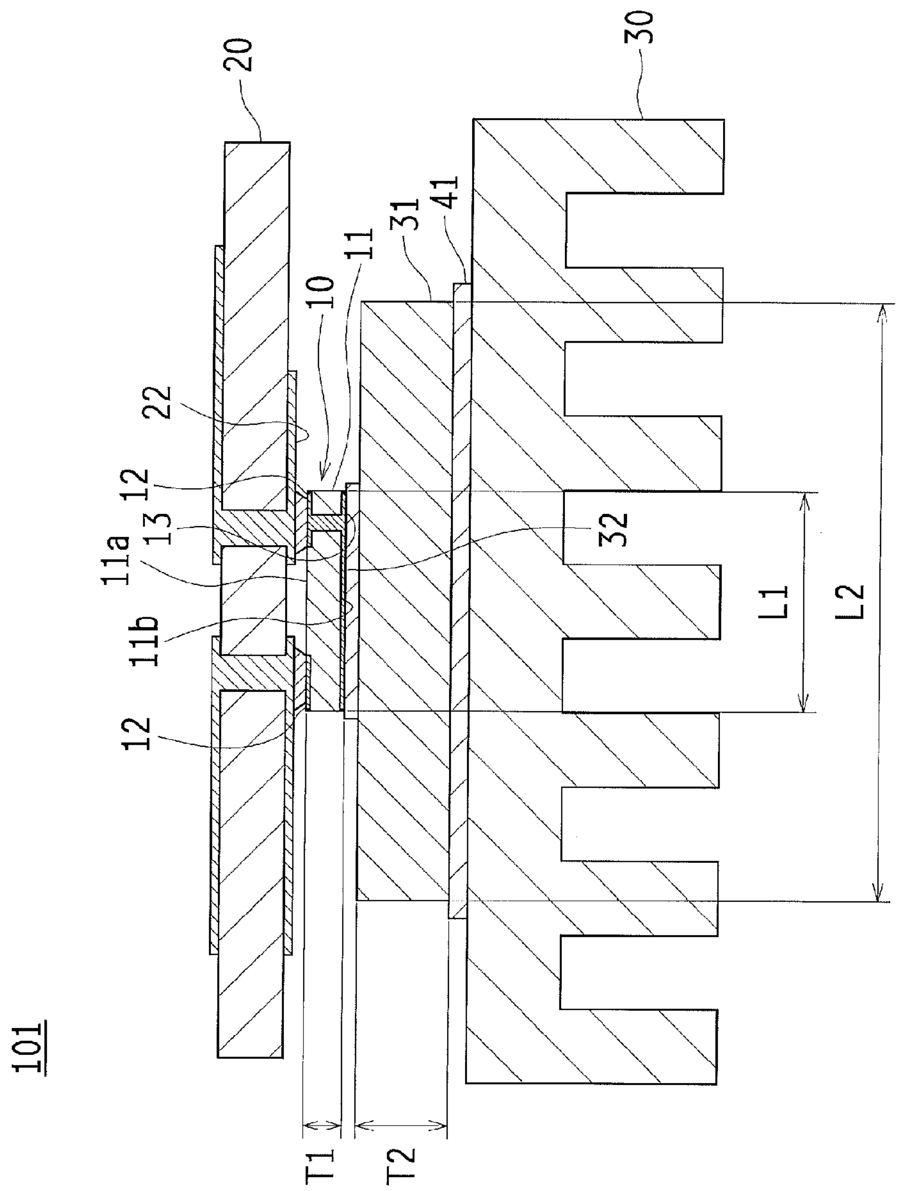
FIG. 1 is a general sectional view of a heat dissipation structure 101 according to a first embodiment of the present invention.

FIG. 1 is a general sectional view of a heat dissipation structure 101 according to a first embodiment of the present invention.

As shown in FIG. 1, in the heat dissipation structure 101, on a heat sink 30 (e.g., thermal conductivity is above 190 W/mk) as an example of having a conductive heat dissipation part, a heat spreader 31 as an example of a non-insulated thermal diffusion device (having a conductive heat dissipation part) is carried via a thin sheet-like insulated part 41 in a manner of bonding or contacting. On the heat spreader 31, a semiconductor device 10 as an example of a heating element and received in an ultrathin package 11 is carried, in a manner of bonding or contacting the heat dissipation surface 11*b* downwards, via the thin non-insulated part 32. The electrode 12 of the electric bonding surface 11*a* is electrically connected to a lower surface pattern 22 of the substrate 20 through welding or the like.

In the semiconductor device 10, the electrodes 12 and the heat dissipation electrode 13 are configured on an inner side relative to the appearance of the package 11, and are controlled to be a substantial package thickness T1. The package thickness T1, for example, is preferably below 2 mm.

The thickness T2 of the heat spreader 31, is preferably, for example, above 2 mm, and the size thereof is greater than that of the semiconductor device 10 but less than that of the heat spreader 30. If the length of one side of the semiconductor device 10 is set as L1, the length L2 of each side of the heat spreader 31 is preferably set as above L1+2×T2. As a material thereof, for example, high thermal conductivity metal whose thermal conductivity is above 190 W/mk may be listed, specifically, copper or aluminum may be listed, but it is not limited to the materials.

As the non-insulated part 32, for example, the material whose thermal conductivity is above 20 W/mk may be listed, specifically, solder or graphite may be listed, but it is not limited to the materials.

The insulated part 41, for example, is set as a member whose thermal conductivity is 1 W/mk to 10 W/mk and withstanding voltage is above 1500 V, and in order to ensure an insulation distance, it is preferably greater than the heat spreader 31.

According to the heat dissipation structure 101, the heat dissipation surface 11*b* of the semiconductor device 10 is contacted to the heat spreader 31 in a non-insulating manner, and the heat spreader 31 contacts the heat sink 30 in a non-insulating manner. Thus, heat produced by the semiconductor device 10 is transferred to the heat spreader 31 from the heat dissipation surface 11*b* via the non-insulated part 32 to be diffused, and then is transferred to the heat sink 30 via the insulated part 41, which thus has excellent heat dissipation.

Second Embodiment

Figure 2:
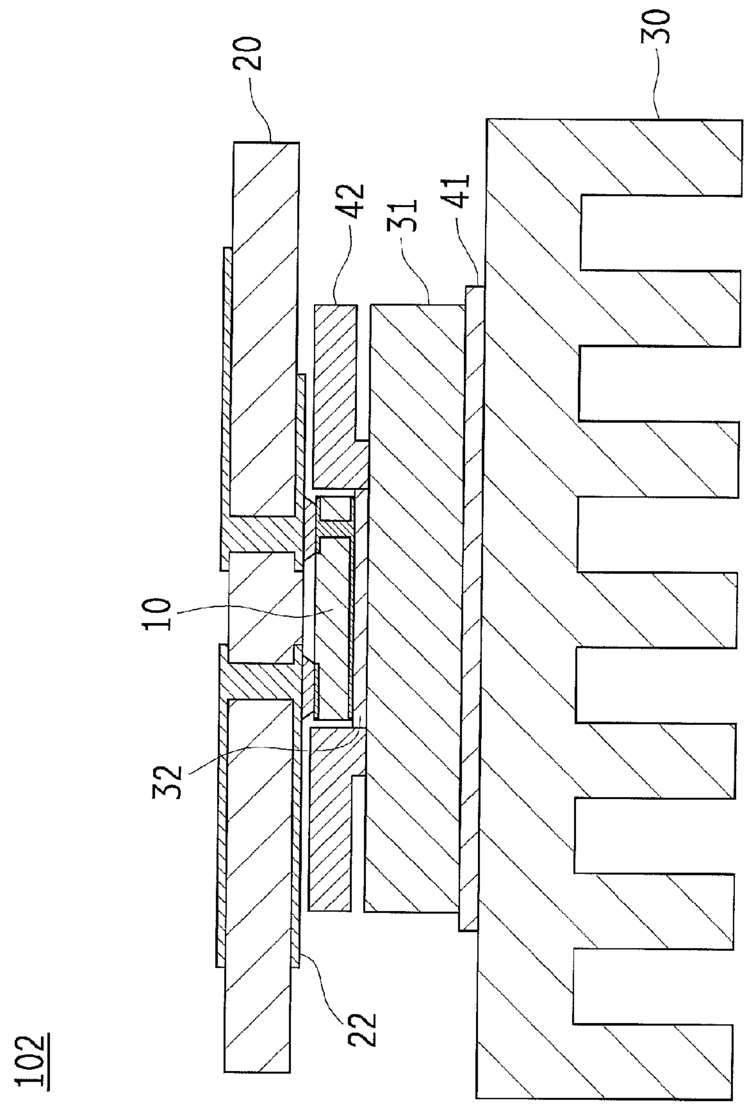
FIG. 2 is a general sectional view of a heat dissipation structure 102 according to a second embodiment of the present invention.

FIG. 2 is a general sectional view of a heat dissipation structure 102 according to a second embodiment of the present invention. In addition, like reference signs are marked for components the same as those of the first embodiment, and the following focuses on describing their differences.

As shown in FIG. 2, in the heat dissipation structure 102, in addition to the structure of the heat dissipation structure 101 of the first embodiment, a sectional horizontal L-shaped insulated part 42 is further inserted between the substrate 20 and the heat spreader 31 in a manner of covering the periphery of the semiconductor device 10 and the pattern of the substrate 20 (a pattern that at least can become a high voltage difference with the heat spreader 31). However, it is not limited to insertion of the insulated part 42, as long as it is configured through coating of the same insulating material or the like in a manner that the insulating material is present on the periphery of the semiconductor device 10. That is, it is set as a structure having an insulating layer of an insulating material in a space sandwiched between the substrate 20 and the heat spreader 31 on the periphery of the semiconductor device 10.

As the insulated part 42, for example, an insulation heat-resistant resin (e.g., PolyPhenylenesulfide (PPS)) formed or cut processed product, an insulation heat-resistant tape, an insulation heat-resistant resin (e.g., epoxy or silicone or the like) sealing element, or a combination of any two or more thereof may be listed, but it is not limited to the materials.

Preferably, a bonding or contacting portion of the heat spreader 31 to the package 11 of the semiconductor device 10 is higher than the surrounding.

According to the heat dissipation structure 102, the heat dissipation surface 11*b* of the semiconductor device 10 is contacted to the heat spreader 31 in a non-insulating manner, and the heat spreader 31 contacts the heat sink 30 in an insulating manner, and then the periphery of the semiconductor device 10 and the pattern of the substrate 20 are covered by the insulated part 42. Thus, the structure can have excellent heat dissipation and can also avoid damage to insulation.

Varying Example of the Second Embodiment

Figure 3:
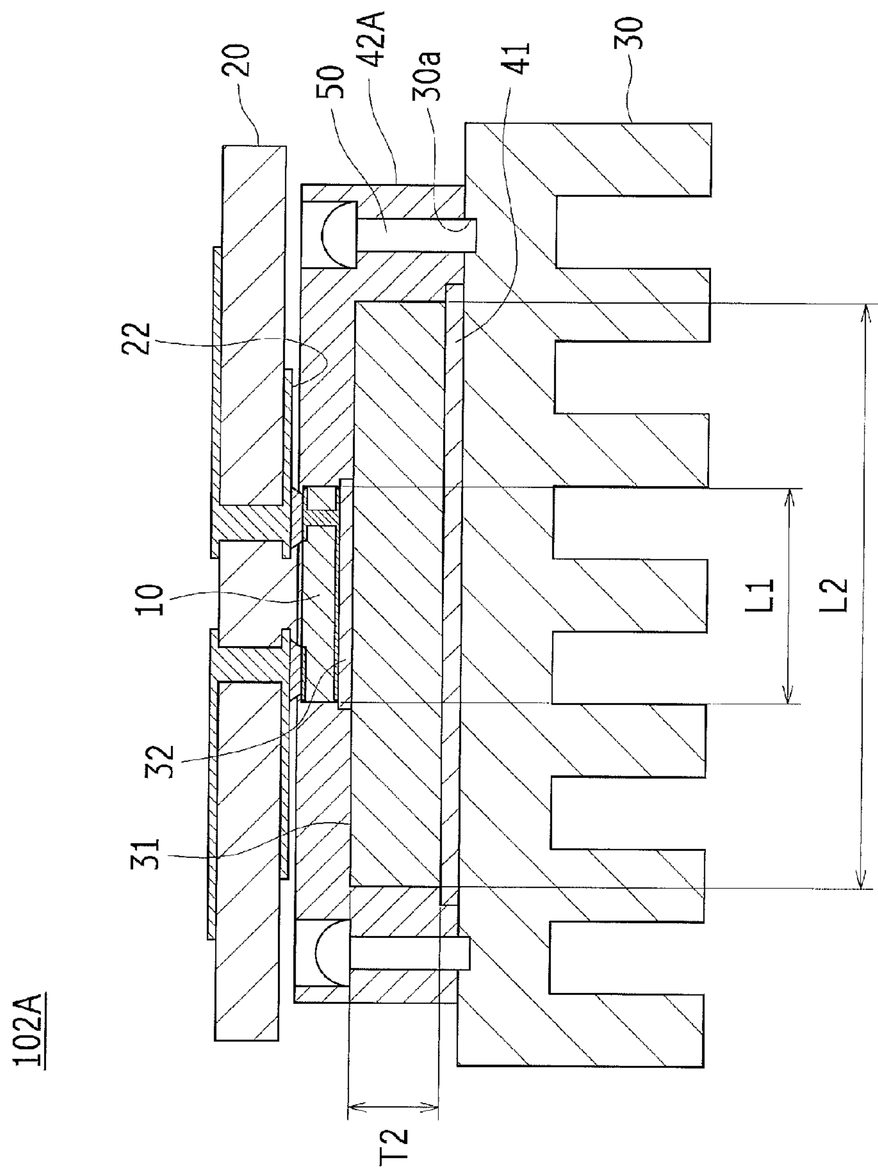
FIG. 3 is a general sectional view of a heat dissipation structure 102A of a varying example of the second embodiment of the present invention.
Figure 4A:
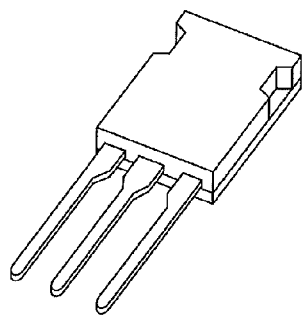
FIG. 4(*a*) is a general stereogram of a lead type discrete part 1 of the prior art, and FIG. 4(*b*) is a general stereogram of a surface-mount semiconductor device 10 like a GaN device developed in recent years.
Figure 4B:
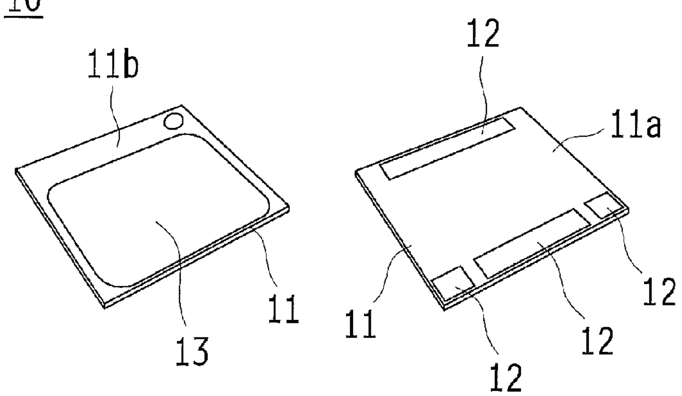
Figure 5A:
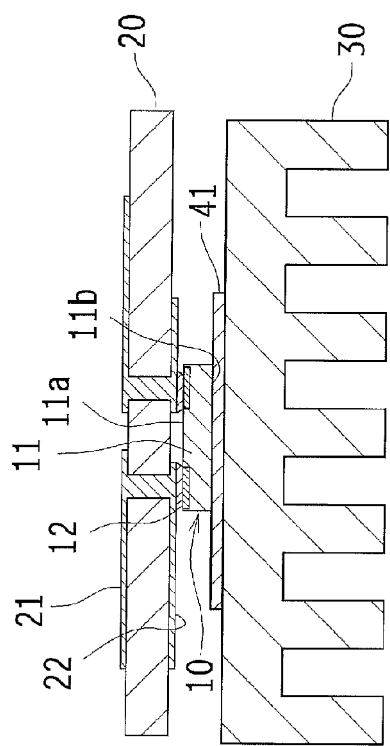
FIG. 5(*a*) is a general sectional view of a heat dissipation structure 201 of the prior art, and FIG. 5(*b*) is a general sectional view of a heat dissipation structure 201A as a varying example thereof.
Figure 5B:
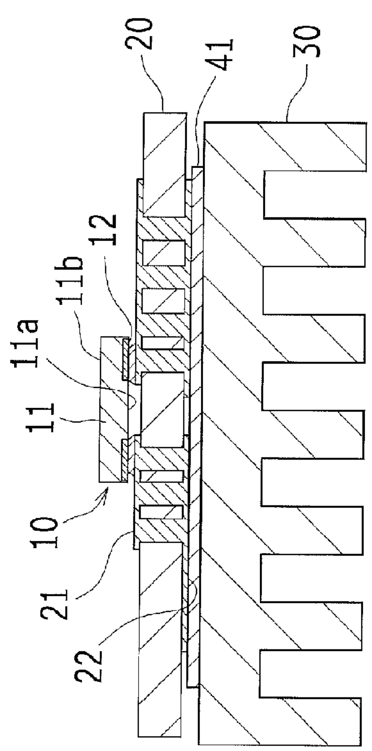

FIG. 3 is a general sectional view of a heat dissipation structure 102A of a varying example of the second embodiment of the present invention. In addition, like reference signs are marked for components the same as those of the first embodiment, and the following focuses on describing their differences.

As shown in FIG. 3, in the heat dissipation structure 102A, in place of the insulated part 42 in the structure of the heat dissipation structure 102 of the second embodiment, an insulated part 42A that occupies the remaining space is inserted between the substrate 20 and the heat sink 30, and is fixed to a screw hole 30*a* disposed on the heat sink 30 by using a screw 50. The insulated part 42A, between the substrate 20 and the heat sink 30, not only covers the semiconductor device 10, but also covers the entire periphery also including a lower surface (also including a lower surface pattern 22) of the substrate 20, the non-insulated part 32, the heat spreader 31 and the insulated part 41.

As the non-insulated part 32, solder or graphite or the like may be listed, but it is not limited to the materials.

As the heat spreader 31, for example, copper-made heat spreaders may be listed, but it is not limited thereto. The thickness T2, for example, is preferably above 2 mm. If the length of one side of the semiconductor device 10 is set as L1, the size (the length of each side is set as L2) is preferably greater than L1+2×T2 but less than the heat sink 30.

As the insulated part 41, an insulated sheet (e.g., the thermal conductivity is 5 W/mk) may be listed, but it is not limited thereto.

As the heat sink 30, for example, an aluminium-made heat sink may be listed, but it is not limited thereto.

According to the heat dissipation structure 102A, similar to the heat dissipation structure 102 of the second embodiment, the heat dissipation surface 11*b* of the semiconductor device 10 is contacted to the heat spreader 31 in a non-insulating manner, and the heat spreader 31 contacts the heat sink 30 in an insulating manner, and then the surrounding of the electrodes 12 of the semiconductor device 10 is covered by the insulated part 42A. Thus, the structure can have excellent heat dissipation and can also avoid damage to insulation.

The structures of the embodiments described above and the varying examples thereof may also be combined with each other as long as there are no special obstructive factors or the like.

In addition, the present invention can be implemented with other various forms without departing from its purport or main features. Therefore, the implementations or embodiments described are merely simple illustrations in all aspects, and should not be construed as limitations. The scope of the present invention is shown by the claims and is not subject to any constraint of the text of the specification. Then, variations or changes within the equivalent scope of the claims all fall within the scope of the present invention.

What is claimed is:

1. A heat dissipation structure of a semiconductor device, the semiconductor device having an electric bonding surface electrically connected with a substrate and a heat dissipation surface on an opposite side thereof, wherein the heat dissipation surface is bonded or contacted to a conductive member with high thermal conductivity via a non-insulated member, the conductive member with high thermal conductivity is bonded or contacted to a heat dissipation part via a first insulated member, and the thickness of the conductive member with high thermal conductivity is greater than that of the semiconductor device, the conductive member with high thermal conductivity, in a top view, is less than the heat dissipation part, and in a situation where the semiconductor device and the conductive member with high thermal conductivity are both set as a substantially rectangular shape in a top view, length of each side of the conductive member with high thermal conductivity is greater than the sum of twice the thickness of the conductive member with high thermal conductivity and length of each side of the semiconductor device.

2. The heat dissipation structure of a semiconductor device according to claim 1, wherein the first insulated member, in a top view, is greater than the conductive member with high thermal conductivity.

3. The heat dissipation structure of a semiconductor device according to claim 1, wherein a second insulated member is configured between the substrate and the conductive member with high thermal conductivity in a manner of covering the periphery of the semiconductor device and at least one part of a pattern of the substrate.

4. The heat dissipation structure of a semiconductor device according to claim 3, wherein the second insulated member is configured in a manner of occupying a space between the substrate and the heat dissipation part.

5. The heat dissipation structure of a semiconductor device according to claim 4, wherein the second insulated member has a through-hole for fixing to the heat dissipation part.

6. The heat dissipation structure of a semiconductor device according to claim 3, wherein the second insulated member is configured through an insulation heat-resistant resin formed or cut processed product, an insulation heat-resistant tape, an insulation heat-resistant sealing element, or a combination of any two or more thereof.

* * * * *